(12) United States Patent
Stocks et al.

(10) Patent No.: US 6,280,646 B1
(45) Date of Patent: Aug. 28, 2001

(54) USE OF A CHEMICALLY ACTIVE RETICLE CARRIER FOR PHOTOMASK ETCHING

(75) Inventors: Richard Stocks; Kevin Donohoe, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/354,303

(22) Filed: Jul. 16, 1999

(51) Int. Cl.$^7$ ........................................................ G03F 7/12
(52) U.S. Cl. ........................ 216/41; 216/58; 438/706; 438/716; 430/5; 430/323; 269/287
(58) Field of Search ........................... 216/12, 24, 41, 216/72, 75, 80; 438/116, 706, 708, 709, 716, 717; 430/311, 313, 316, 322, 323, 5; 206/449, 455, 453; 269/287; 248/684

(56) References Cited

U.S. PATENT DOCUMENTS

| | | | |
|---|---|---|---|
| 4,548,883 | * 10/1985 | Wagner | 430/5 |
| 4,764,432 | * 8/1988 | Kalbitzer | 428/446 |
| 4,830,182 | 5/1989 | Nakazato et al. . | |
| 5,160,957 | 11/1992 | Ina et al. . | |
| 5,227,269 | * 7/1993 | Scott | 430/5 |
| 5,320,225 | 6/1994 | Kirkpatrick . | |
| 5,353,934 | * 10/1994 | Yamauchi | 206/455.4 |
| 5,401,932 | * 3/1995 | Hashimoto et al. | 219/69.17 |
| 5,663,017 | 9/1997 | Schinella et al. . | |
| 5,705,300 | * 1/1998 | Bae | 430/5 |
| 5,727,685 | 3/1998 | Laganza et al. . | |
| 5,756,249 | * 5/1998 | Ellis | 430/201 |
| 5,786,116 | * 7/1998 | Rolfson | 430/5 |
| 5,811,211 | 9/1998 | Tanaka et al. . | |
| 5,812,271 | 9/1998 | Kim . | |
| 5,827,625 | 10/1998 | Lucas et al. . | |
| 5,849,440 | * 12/1998 | Lucas et al. | 430/5 |
| 5,861,330 | * 1/1999 | Baker et al. | 438/232 |
| 5,972,798 | * 10/1999 | Jang et al. | 438/717 |

FOREIGN PATENT DOCUMENTS

401023534-A * 1/1989 (JP) ................................ H01L/21/30

OTHER PUBLICATIONS

T.C. Chieu et al., "Fabrication of Phase Shifting Masks Employing Multilayer Films", SPIE, vol. 2197, pp. 181–193.

* cited by examiner

Primary Examiner—Randy Gulakowski
Assistant Examiner—J Smetana
(74) Attorney, Agent, or Firm—Dickstein Shapiro Morin & Oshinsky, LLP

(57) ABSTRACT

A method and apparatus for improving etch uniformity in reticle etching by eliminating local effects at the edge of the reticle is disclosed. The present invention relates to a reticle frame which surrounds the reticle. The reticle frames are patterned with a pattern profile similar to that of the reticle to prevent edge uniformities of the reticle by allowing uniform plasma etching of the entire reticle surface. The reticle frames may also be used to move the reticle in and out of etch chambers without damaging them.

43 Claims, 7 Drawing Sheets

USE OF A CHEMICALLY ACTIVE RETICLE CARRIER FOR PHOTOMASK ETCHING

FIELD OF THE INVENTION

The present invention relates to the field of photolithography used in fabricating semiconductor devices and, more particularly to a method and apparatus for improving etch uniformity in reticle etching by eliminating local etching effects at the edge of the reticle.

DESCRIPTION OF THE RELATED ART

In the manufacture of semiconductor wafers, photolithography is used to pattern various layers on a wafer. A layer of resist is deposited on the wafer and exposed using an exposure tool and a template such as a mask or reticle. During the exposure process a form of radiant energy, such as ultraviolet light, is directed through the reticle to selectively expose the resist in a desired pattern. The resist is then developed to remove either the exposed portions, for a positive resist, or the unexposed portions, for a negative resist, thereby forming a resist mask on the wafer. The resist mask can then be used to protect underlying areas of the wafer during subsequent fabrication processes, such as deposition, etching, or ion implantation processes.

An integral component of the photolithographic process is the reticle. The reticle includes the pattern corresponding to features (e.g., transistors or polygates) at a layer of the integrated circuit (IC) design. The reticle may be a transparent glass plate coated with a patterned light blocking material such as, for example, chromium. This type of reticle is typically referred to as a binary mask since light is completely blocked by the light blocking material and fully transmitted through the transparent glass portions.

Another type of reticle is the attenuated phase shift mask (PSM). Attenuated PSMs utilize partially transmissive regions instead of the light blocking regions used in binary masks. The partially transmissive regions typically pass (i.e., do not block) about three to eight percent of the light they receive. Moreover, the partially transmissive regions are designed so that the light that they do pass is shifted by 180 degrees in comparison to the light passing through the transparent (e.g., transmissive) regions.

During the fabrication of reticles, the reticle is often affected by edge effects in the etching chamber. Reference is made to FIGS. 1–3. FIG. 1 shows a plasma etching system 10 including a radio frequency ("RF") source power supply 11, a coil 12, a chamber 13, a dielectric plate 9, a multi-frequency bias power supply 15, and a decoupling capacitor 16. The chamber 13 is connected to a ground potential 17. Reticle 18 is mounted onto electrode 14 which applies a bias voltage or bottom power. Electrode 14 may be an electrostatic-chuck or susceptor for holding the reticle 18 during the etching process. Modulated-bias plasma 19 is generated in chamber 13 from source material 20. Source material 20 may be provided to chamber 13 via one or more feed tubes 52. Reticle has a chrome layer 21 formed thereon and a patterned photoresist layer 22 formed over chrome layer 21. Reticle 18 is reacted with plasma 19 to etch a portion of a surface of chrome layer 21 according to the patterned photoresist 22 to impart the pattern onto the reticle 18. As can be seen from FIGS. 1–3, the reticle 18 is positioned directly over electrode 14. As the plasma bombards the reticle, it etches the reticle on an upper surface as well as at the edges of the reticle 18. FIG. 2 shows a top view of the etched reticle and FIG. 3 shows a cross section of the reticle as shown in FIG. 2. The reticle suffers from edge effects in the etching of the reticle. These edge effects are caused by the existence of the edge of the reticle and the nonuniformity in the reticle formed due to nonuniformity of chemical loading and electrical power at the edge of the reticle. The edge effects may be manifest as a different print quality at the edge of the reticle. Thus, if an integrated circuit pattern extends to the edge of the reticle it will be adversely affected by these edge effects.

There is a need to eliminate edge effects in the reticle to prevent edge anomalies from being transferred onto an integrated circuit or onto a mask used in fabrication of an integrated circuit. This is especially true as feature sizes continue to dramatically decrease, and as the number of features within the IC design continues to increase, it requires reticles which can use a greater portion of the surface for transferring a pattern to an integrated circuit. Accordingly, there is a need and desire for a method and apparatus for eliminating edge effects from the high density etchers in the formation of reticles.

SUMMARY OF THE INVENTION

The present invention provides a method and apparatus for improving etch uniformity in reticle etching by eliminating local effects at the edge of the reticle. Specifically, the invention relates to a reticle carrier which surrounds the reticle and is subjected to a plasma etch along with the reticle to reduce edge non-uniformities. The reticle carrier may also be used to move reticles in and out of etch chambers without damaging or contaminating them. To help reduce edge non-uniformities, the reticle carriers are formed of materials similar to that of the reticle and are patterned with a pattern profile similar to that of the reticle.

Additional advantages of the present invention will be apparent from the detailed description and drawings, which illustrate preferred embodiments of the invention.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention. The following detailed description is, therefore, not to be taken in a limiting sense, as the scope of the present invention is defined by the appended claims.

Figure 4:
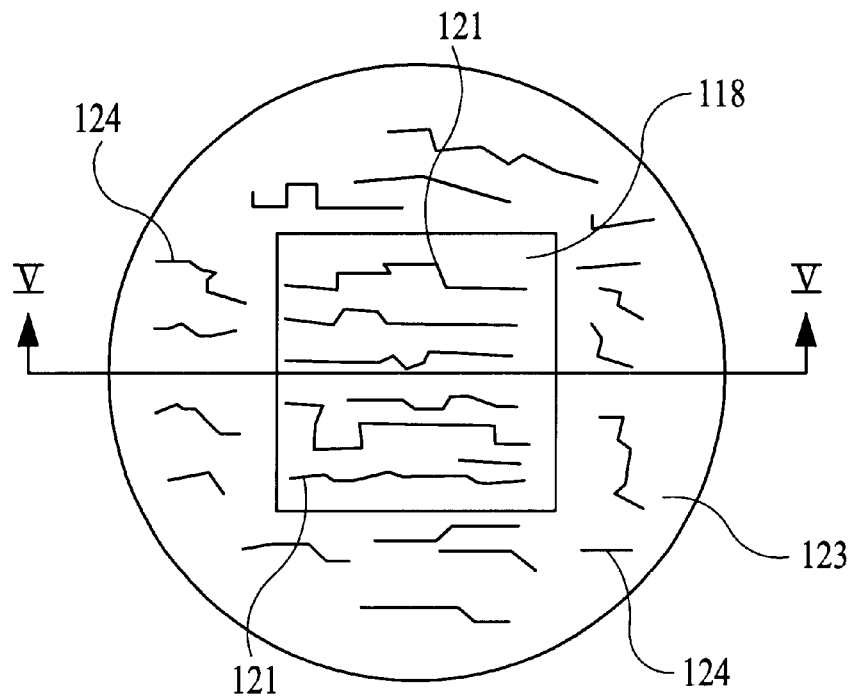
FIG. 4 is a top view of a reticle placed on the reticle carrier according to the present invention.

Reference is now made to FIG. 4. This figure shows a top view of the reticle 118 and frame 123 surrounding reticle 118 according to the present invention. While the reticle 118 is depicted as square in shape and the frame 123 is depicted as being circular in shape, it should be understood that these components could be any desired shape. For example, both the reticle 118 and the frame 123 may be rectangular in shape. The reticle 118 may be formed of any suitable material for example, silica glass, fused quartz glass, borosilicate glass or another material transparent to various types of radiation commonly used in semiconductor lithographic operations. Preferably the reticle is formed of quartz. Further, the reticle may be any reticle including a light blocking reticle, a phase shifting reticle, an attenuated phase shifting reticle, a hard phase shift reticle or a multi-layered phase shifting reticles.

Reticle 118 has formed thereon patterned light blocking or partially light transmissive regions 121 formed on the surface of the reticle 118 depending upon whether the reticle is a binary reticle or a phase shifting reticle. The light blocking regions 121 can be a homogeneous metal layer, such as chrome, gold, or the like. Alternatively, the light blocking regions 121 may be a composite material of different metals, such as chrome and gold, or chrome and another metal, or the like. In yet another alternative, partially light transmissive regions 121 can be formed of any attenuating material employed in a phase shifting mask, such as, for example, molybdenum silicide.

The reticle 118 is placed on frame 123. Frame 123 is formed of a material similar to that of reticle 118 such that the reticle 118 and frame 123 have similar chemical and electrical properties in the plasma etcher. Accordingly, it is preferable that the frame 123 be formed of silica glass, fused quartz glass, borosilicate glass or another material transparent to various types of radiation commonly used in semiconductor lithographic operations. Preferably the frame 123 is formed of quartz.

The frame 123 is also patterned with a light blocking or partially light transmissive region similar to that of reticle 118. Thus, frame 123 has formed thereon patterned light blocking or partially light transmissive regions 124 formed on the surface of the frame 123 depending upon whether the reticle 118 is a binary reticle or a phase shifting reticle. The light blocking regions 124 can be a homogeneous metal layer, such as chrome, gold, or the like. Alternatively, the light blocking regions 124 may be a composite material of different metals, such as chrome and gold, or chrome and another metal, or the like. In yet another alternative, partially light transmissive regions 124 can be formed of an attenuating material employed in a phase shifting mask, such as, for example, molybdenum silicide.

The light blocking or partially light transmissive region 124 formed on frame 123 may be formed during the formation of light blocking or partially light transmissive region 121 on reticle 118, or at a time prior to or subsequent to the patterning of the reticle 118. This is discussed in more detail below in reference to the method for forming the reticle 118 with reference to FIGS. 8–9.

Figure 5:
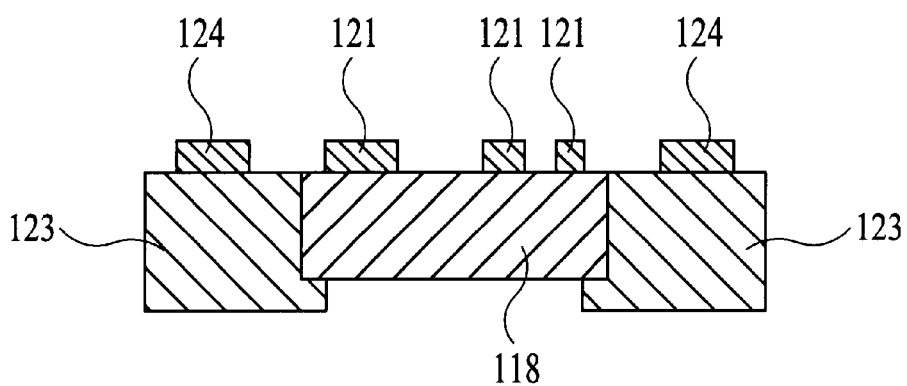
FIG. 5 is a view of the reticle carrier of the present invention taken along the line V—V of FIG. 4.

Reference is now made to FIG. 5. This figure is a cross sectional view along line V—V as shown in FIG. 4. As can be seen from the figure, the reticle 118 is supported at a bottom layer of reticle 118 by L-shaped sections of frame 123. While frame 123 is shown as having L-shaped sections near the bottom of the frame 123, it should be understood that any suitable support may be used to support reticle 118 within frame 123. For example, the frame may have angled support pieces or round nubs formed at the bottom of the frame to support reticle 118. In addition, frame is designed such that the upper surface of reticle 118 and frame 123 are essentially coplanar.

Figure 1:
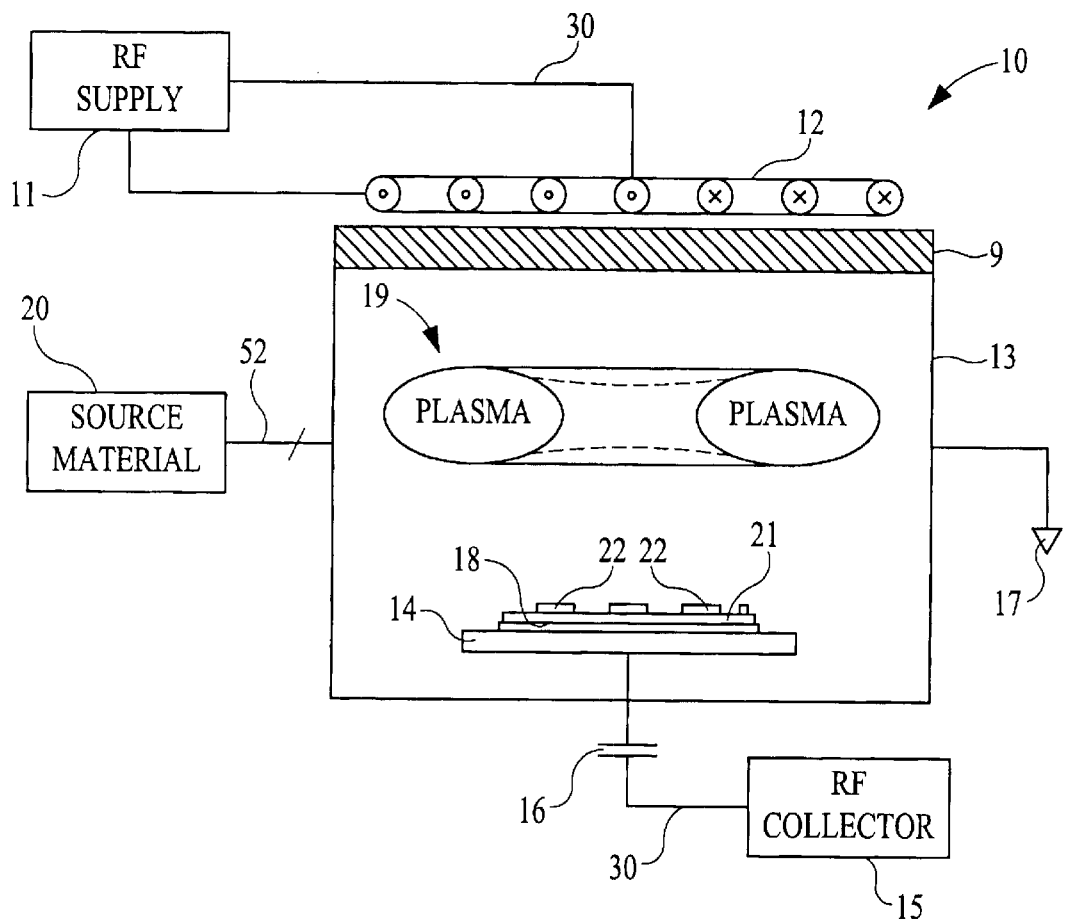
FIG. 1 is a schematic view of a conventional plasma etching system.
Figure 2:
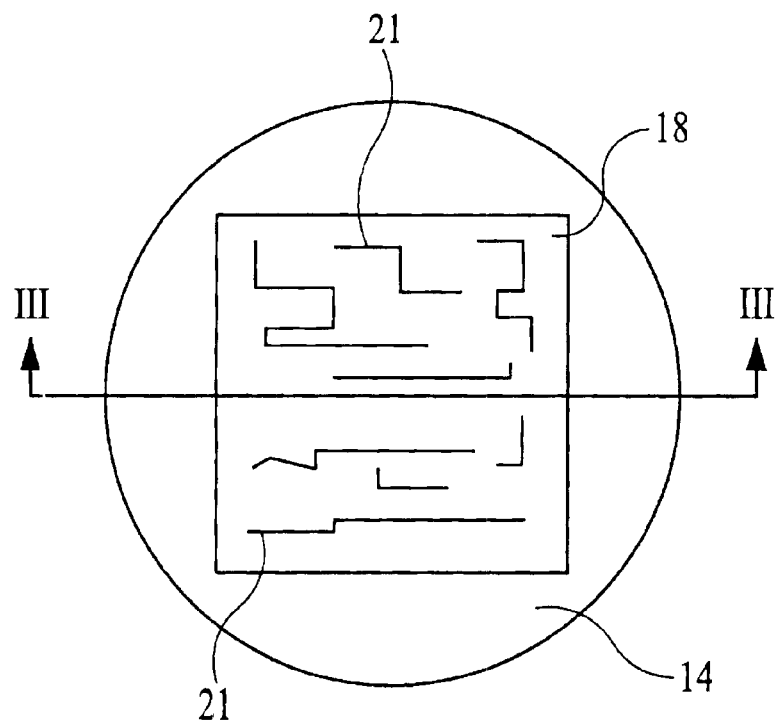
FIG. 2 is a top view of a conventional reticle placed on a chuck.
Figure 3:
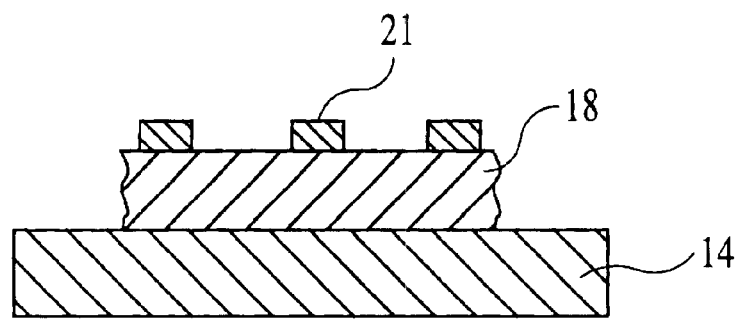
FIG. 3 is a view taken along the line III—III of FIG. 2.
Figure 6A:
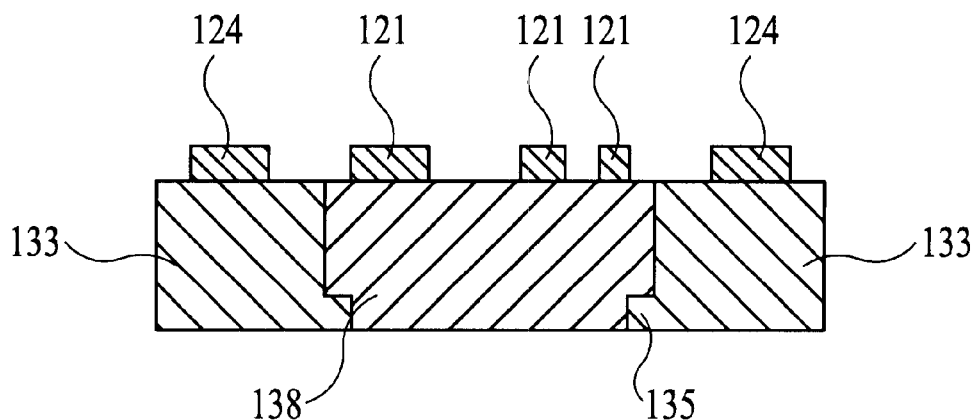
FIG. 6A is a cross sectional view of the reticle and carrier according to a second embodiment of the present invention.
Figure 6B:
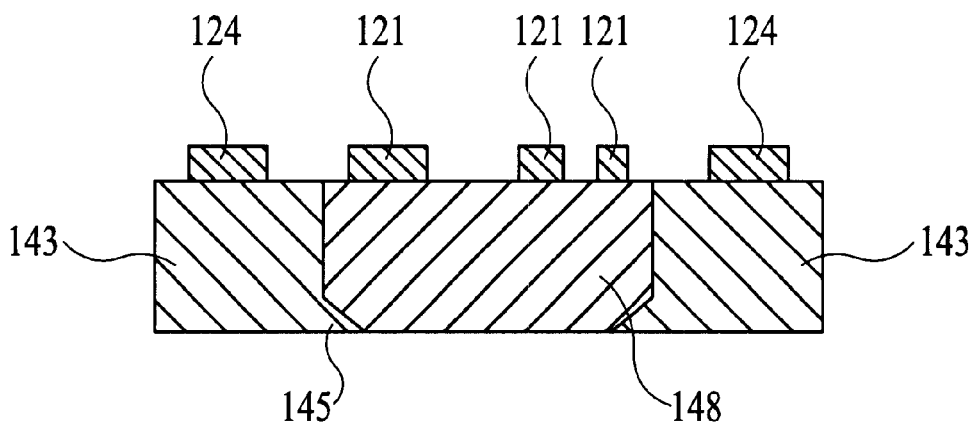
FIG. 6B is a cross sectional view of the reticle and carrier according to a third embodiment of the present invention.

An alternative embodiment of the present invention is shown with reference to FIGS. 6A and 6B. Reference is first made to FIG. 6A. This figure shows a reticle 138 having a portion of the bottom of the reticle 138 cut away in a square cross section so as to engage protruding portions 135 of frame 133. Reference is now made to FIG. 6B where reticle 148 having a portion of the bottom of the reticle 148 cut away in a triangular cross section so as to engage complimentary triangular protruding portions 145 of frame 143. As can be seen from FIGS. 6A and 6B, the upper and lower surfaces of the reticles 138, 148 are coplanar with the upper and lower surfaces of frames 133, 143. The presence of portions of frame 123, 133, 143 directly adjacent to the edges of reticle 118, 138, 148 provides a more uniform etching surface on both sides of the reticle, which, in turn, allows even chemical loading and electrical power across both the reticle 118, 138, 148 and frame 123, 133, 143 using a conventional plasma etching apparatus similar to that depicted in FIG. 1.

Figure 7:
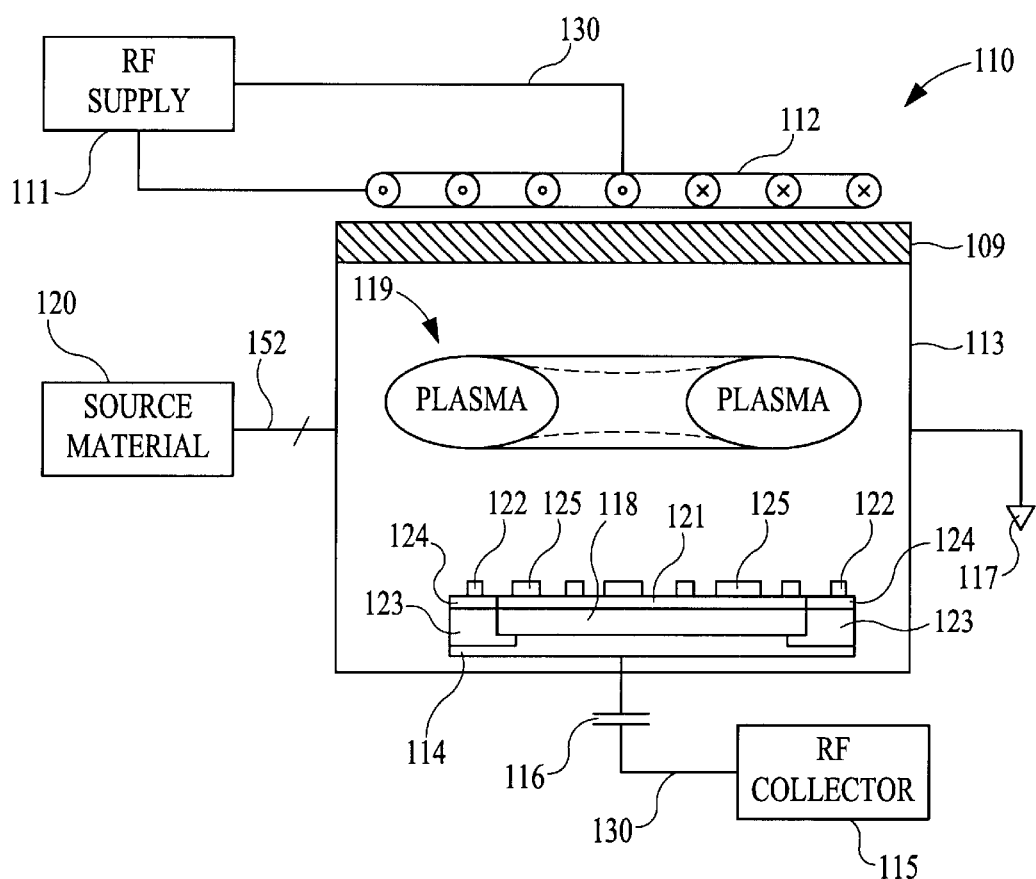
FIG. 7 is a schematic view of a reticle plasma etching system using a reticle carrier according to the present invention.

Reference is made to FIG. 7 which shows a plasma etching system 110 including a radio frequency ("RF") source power supply 111, a coil 112, a chamber 113, a dielectric plate 109, a multi-frequency bias power supply 115, and a decoupling capacitor 116. The chamber 113 is connected to a ground potential 117. Reticle 118 is mounted on a frame 123 and then mounted onto an electrode 114 which applies a bias voltage or bottom power. Electrode 114 is formed such that electrode 114 contacts both frame 123 and reticle 118. The electrode 114 may have a raised column structure to efficiently contact both the frame 123 and electrode 118 as illustrated in FIG. 7.

Modulated-bias plasma 119 is generated in chamber 113 from source material 120. Source material 120, such as, for example, HBr, $O_2$, Ar, Cl, fluorocarbon containing gases and the like, may be provided to chamber 113 via one or more feed tubes 152. Reticle 118 has a light blocking or partially light transmissive region, such as a chrome layer, 121 formed thereon and a patterned photoresist layer 125 formed over chrome layer 121. Frame 123 has a light blocking or partially light transmissive region, such as a chrome layer, 124 formed thereon and a patterned photoresist layer 122 formed over chrome layer 124 in the manner described above. Reticle 118 and patterned frame 123 are reacted with plasma 119 to etch a portion of a surface of chrome layer 121, 124 according to the patterned photoresist 125, 122 to impart the pattern onto the reticle 118 and frame 123. Reticle 118 and frame 123 are then removed from the chamber 113, reticle 118 is removed from frame 123 and the remaining photoresist layers 125 are removed from the reticle 118.

As can be seen from FIG. 7, the reticle 118 is positioned within frame 123 and both frame 123 and reticle 118 are in direct contact with electrode 114. As the plasma bombards and etches the reticle 118, it also bombards and etches the frame 123, thus reducing the edge effect at the upper surface of reticle 118 caused by nonuniformity in chemical loading and electrical power at the edge of reticle 118. Thus, a greater surface area of the reticle can be used to transfer a pattern onto an integrated circuit. Additionally, by eliminating edge effects, the present invention allows the use of the perimeter of the surface of the reticle which are currently not patterned. The present invention therefore would provide an increase of greater than about 150 mm² of reticle surface area to transfer patterns to an integrated circuit device.

Figure 8:
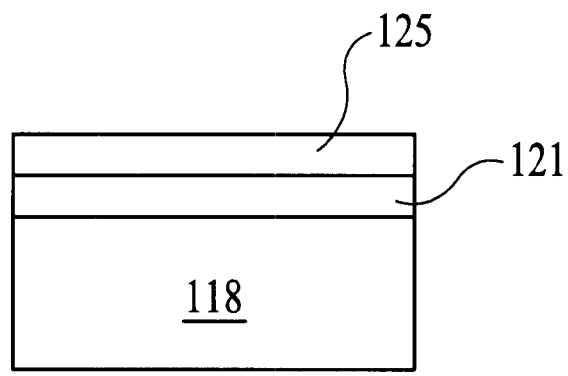
FIG. 8 shows a reticle undergoing an intermediate stage of processing according to the present invention.

The method for fabricating a reticle according to the present invention will now be described with reference to FIGS. 8–11. Reference is first made to FIG. 8. A light blocking or partially light transmissive layer 121 is deposited over a reticle substrate 118 which may be formed of silica glass, fused quartz glass, borosilicate glass or another material transparent to various types of radiation commonly used in semiconductor lithographic operations, by any conventional method. Light blocking or partially light transmissive layer 121 is then deposited which may be any suitable material such as a homogeneous metal layer, such as chrome, gold, or the like or a composite material of different metals, such as chrome and gold, or chrome and another metal, or the like. Light blocking or partially light transmissive layer 121 may also be an attenuating material employed in a phase shifting mask such as a molybdenum silicide. A pattern transfer layer 125 is then deposited over light blocking or partially light transmissive layer 121. Pattern transfer layer 125 may be any material used to transfer a pattern to a subsequent layer and will depend upon the radiation characteristics of the equipment used to form the lithographic reticle 118. For example, where an electron beam direct write system is used, pattern transfer layer 125 will be formed of an electron beam sensitive photoresist. Alternatively, where an optical system is used to generate radiation of a particular wavelength, pattern transfer layer 125 will be a conventional photoresist material sensitive to the particular wavelength. It should be understood that those skilled in the art will recognize that many different combinations of materials can be used to form the layers shown in FIG. 8.

Figure 9:
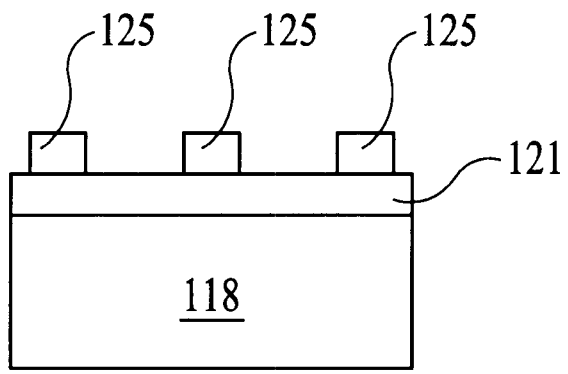
FIG. 9 a reticle undergoing a processing according to the present invention at a point subsequent to that shown in FIG. 8.

Reference is made to FIG. 9. After preparing reticle substrate 118 with light blocking or partially light transmissive layer 121 and pattern transfer layer 125, pattern transfer layer 125 is exposed to radiation by a scanning electron beam or laser. Radiation emerging from a radiation source is imaged onto pattern transfer layer 125. The imaging process results in the transfer of a pattern present in a reticle generating data base to pattern transfer layer 125.

The pattern transfer layer 125 is written with an electron beam direct write system and the pattern transfer layer is developed to arrive at the structure illustrated in FIG. 9. The present invention contemplates the use of many different types of pattern transfer layer 123 depending upon the particular lithographic system to be used in the fabrication of semiconductor devices, this includes deep-ultraviolet (deep UV), x-ray, and standard i-line and g-line lithographic systems. While the transfer of pattern will typically use an electron beam direct write system, it is also possible to perform pattern transfer using an optical imaging process using radiation having a wavelength ranging from the deep-UV to about 200 nanometers to optical wavelengths up to about 440 nanometers.

The lithographic pattern may includes a large number of patterned metal features overlying reticle substrate 118. The exact arrangement of the lithographic pattern will depend upon the particular masking level for which lithographic reticle 118 is to be used. For example, where lithographic reticle 118 is to be used to form interconnect traces in a semiconductor device, the lithographic pattern will include a series of lead traces having the necessary geometric arrangement to form metal interconnects in a semiconductor device. In other applications, reticle 118 can be used to form, for example, gate electrodes in a semiconductor device, or via openings in an interlevel dielectric layer, and the like.

It should be understood that those skilled in the art will recognize the reticles can be of two general types, either brightfield or darkfield. In a brightfield reticle patterned features to be transferred are opaque features on a clear background. The process of the invention is intended to function with either type of reticle. In the case of a darkfield reticle, the lithographic pattern will appear as openings in a sheet of opaque material overlying reticle substrate 118.

Figure 10:
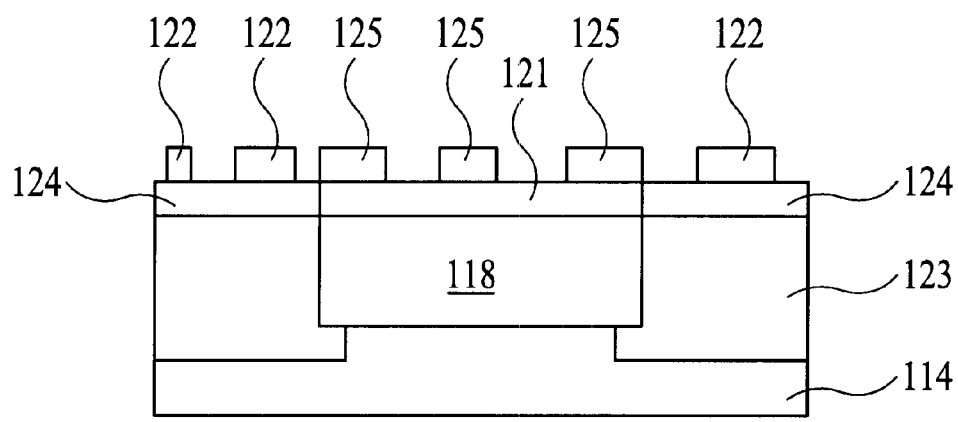
FIG. 10 a reticle undergoing a processing according to the present invention at a point subsequent to that shown in FIG. 9.

Reference is now made to FIG. 10. Reticle 118 having a light blocking or partially light transmissive region 121 overlying reticle substrate 118 and a pattern transfer layer 125 overlying light blocking or partially light transmissive region 121 is placed on reticle frame 123. Reticle frame 123 is independently deposited with a light blocking or partially light transmissive layer 124 and patterned with a pattern transfer layer 122. Because the frame 123 will ultimately be discarded, it is not essential that the frame be patterned with the precision of the electron beam writing system as used for reticle 118. In fact, the frame 123 may be patterned with crude lithography of about 2 to 3 times the design geometry rule of reticle 118. While the frame 123 should be patterned with approximately the same pattern density as reticle 118, frame 123 does not need to be patterned with the same precision as reticle 118. This allows efficient use of the writing system. While the present invention has been described by patterning the frame 123 and reticle 118 separately, it should be understood that reticle 118 and frame 123 may also be patterned in the same step. The reticle 118 and frame 123 are then placed onto an electrode 114 in a high-density plasma etcher, as depicted in FIG. 10.

Figure 11:
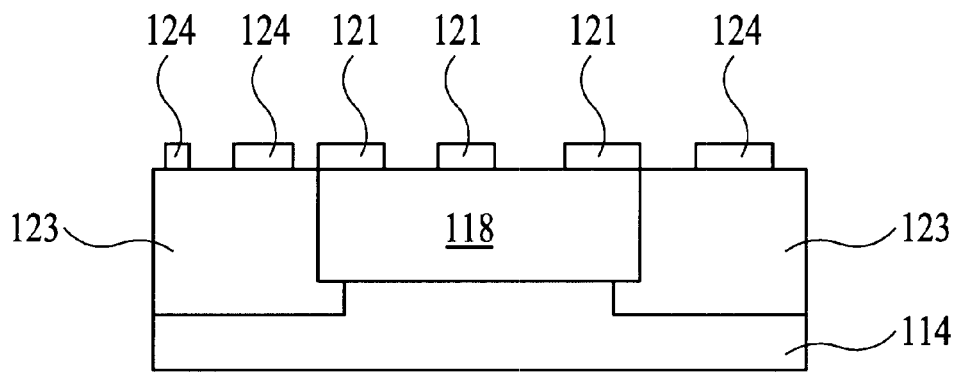
FIG. 11 a reticle undergoing a processing according to the present invention at a point subsequent to that shown in FIG. 10.

Reference is now made to FIG. 11. After preparing reticle substrate 118 with light blocking or partially light transmissive region 121 and pattern transfer layer 125 and preparing frame 123 with light blocking or partially light transmissive region 124 and pattern transfer layer 122, the light blocking or partially light transmissive regions 121, 124 are removed from the reticle 118 and frame 123 in a high-density plasma etcher. Since the reticle 118 and frame 123 are both formed of materials that are electrically and chemically similar and have similar pattern density, edge effects in the plasma etcher are reduced or eliminated. Thus, the reticle can be formed such that a greater surface of the reticle may be patterned.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed is:

1. A method for etching a reticle comprising:
   providing a reticle having at least a first light blocking or partially light transmnissive layer thereon and at least a first pattern transfer layer on said first light blocking or partially light transmissive layer;
   providing a frame having an opening for receiving said reticle, said frame having at least a second light blocking or partially light transmissive layer thereon and at least a second pattern transfer layer on said second light blocking or partially light transmissive layer, wherein said second light blocking or partially light transmissive layer has physical and chemical properties which will increase uniformity of the etching of said reticle when said frame containing said reticle is exposed to a plasma;
   placing said reticle in said frame; and
   etching said reticle and frame with a plasma.

2. The method according to claim 1, wherein said first light blocking or partially light transmissive layer is a light blocking layer.

3. The method according to claim 1, wherein said first light blocking or partially light transmissive layer is a partially light transmissive layer.

4. The method according to claim 2, wherein said second light blocking or partially light transmissive layer is a light blocking layer.

5. The method according to claim 3, wherein said second light blocking or partially light transmissive layer is a partially light transmissive layer.

6. The method according to claim 1, wherein said first light blocking or partially light transmissive layer comprises chrome.

7. The method according to claim 6, wherein said second light blocking or partially light transmissive layer comprises chrome.

8. The method according to claim 1, wherein said first light blocking or partially light transmissive layer comprises molybdenum silicide.

9. The method according to claim 8, wherein said second light blocking or partially light transmissive layer comprises molybdenum silicide.

10. The method according to claim 1, wherein said first pattern transfer layer is photoresist.

11. The method according to claim 1, wherein said reticle is formed of a material selected from the group consisting of quartz, silica glass and borosilicate glass.

12. The method according to claim 11, wherein said frame is formed of a material selected from the group consisting of quartz, silica glass and borosilicate glass.

13. The method according to claim 1, wherein said first light blocking or partially light transmissive layer is selected from the group consisting of chrome, gold and molybdenum silicide.

14. The method according to claim 1, wherein said second light blocking or partially light transmissive layer is selected from the group consisting of chrome, gold and molybdenum silicide.

15. The method according to claim 1, further comprising forming said first light blocking or partially light transmissive layer and said first pattern transfer layer on said first light blocking or partially light transmissive layer of said reticle at a time different from that of forming said second light blocking or partially light transmissive layer and said second pattern transfer layer on said second light blocking or partially light transmissive layer of said frame.

16. The method according to claim 1, further comprising forming said first light blocking or partially light transmissive layer and said first pattern transfer layer on said first light blocking or partially light transmissive layer of said reticle at the same time as forming said second light blocking or partially light transmissive layer and said second pattern transfer layer on said second light blocking or partially light transmissive layer of said frame.

17. A method for forming a reticle comprising:
   providing a reticle substrate;
   forming at least a first light blocking or partially light transmissive layer thereon;
   forming at least a first pattern transfer layer on said first light blocking or partially light transmissive layer;
   patterning said pattern transfer layer with a predetermined pattern;
   providing a frame having an opening to support said reticle;
   forming at least a second light blocking or partially light transmissive layer on said frame;
   forming at least a second pattern transfer layer on said second light blocking or partially light transmissive layer, wherein said second light blocking or partially light transmissive layer has physical and chemical properties which will increase uniformity of the etching of said reticle when said frame containing said reticle is exposed to a plasma;
   patterning said second pattern transfer layer with a predetermined pattern;
   placing said reticle in said frame; and
   etching said reticle and said frame with a plasma.

18. The method according to claim 17, wherein forming said first light blocking or partially light transmissive layer includes forming a light blocking layer.

19. The method according to claim 17, wherein forming said first light blocking or partially light transmissive layer includes forming a partially light transmissive layer.

20. The method according to claim 18, wherein forming said second light blocking or partially light transmissive layer includes forming a light blocking layer.

21. The method according to claim 17, wherein forming said second light blocking or partially light transmissive layer includes forming a partially light transmissive layer.

22. The method according to claim 17, wherein forming said first light blocking or partially light transmissive layer includes forming a chrome layer.

23. The method according to claim 22, wherein forming said second light blocking or partially light transmissive layer includes forming a chrome layer.

24. The method according to claim 17, wherein forming said first light blocking or partially light transmissive layer comprises forming a molybdenum silicide layer.

25. The method according to claim 24, wherein forming said second light blocking or partially light transmissive layer comprises forming a molybdenum silicide layer.

26. The method according to claim 17, wherein said first pattern transfer layer is photoresist.

27. The method according to claim 17, wherein said first pattern transfer layer is patterned by an electron beam.

28. The method according to claim 17, wherein an upper surface of said reticle and an upper surface of said frame are coplanar.

29. The method according to claim 17, wherein said reticle is formed of a material selected from the group consisting of quartz, silica glass and borosilicate glass.

30. The method according to claim 29, wherein said frame is formed of a material selected from the group consisting of quartz, silica glass and borosilicate glass.

31. The method according to claim 17, wherein said first light blocking or partially light transmissive layer is selected from the group consisting of chrome, gold and molybdenum silicide.

32. The method according to claim 31, wherein said second light blocking or partially light transmissive layer is selected from the group consisting of chrome, gold and molybdenum silicide.

33. The method according to claim 30, wherein said reticle and said frame are formed of the same material.

34. The method according to claim 32, wherein said first and second light blocking or partially light transmissive layer are formed of the same material.

35. A method for etching a reticle comprising:

placing a reticle having a patterned layer thereon to be etched in a frame, whereby said edges of said reticle abut inside side edges of said frame and a top layer of said reticle is coplanar with a top layer of said frame, said frame having a property of reducing side edge effects from forming in said reticle when said reticle is placed in said frame and said reticle and said frame are exposed to a plasma etching environment; and etching said reticle while in said frame in a plasma etching environment.

36. The method according to claim 35, wherein said reticle is formed of a material selected from the group consisting of quartz, silica glass and borosilicate glass.

37. The method according to claim 35, wherein said frame is formed of a material selected from the group consisting of quartz, silica glass and borosilicate glass.

38. The method according to claim 35, wherein said reticle is patterned with a layer is selected from the group consisting of chrome, gold and molybdenum silicide.

39. The method according to claim 35, wherein said frame is patterned with a layer is selected from the group consisting of chrome, gold and molybdenum silicide.

40. The method according to claim 35, wherein said reticle and said frame are formed of the same material.

41. The method according to claim 40, wherein said reticle and said frame are formed of quartz.

42. The method according to claim 35, wherein said reticle and frame are patterned with the same material.

43. The method according to claim 42, wherein said material is chrome.

\* \* \* \* \*